United States Patent
Jhan et al.

(10) Patent No.: US 12,397,256 B2
(45) Date of Patent: Aug. 26, 2025

(54) SERVER DEVICE AND FILTER REPLACEMENT REMINDER METHOD THEREOF

(71) Applicant: Wistron Corporation, New Taipei (TW)

(72) Inventors: Bo-Cheng Jhan, New Taipei (TW); Yi-Hsuan Chueh, New Taipei (TW)

(73) Assignee: Wistron Corporation, New Taipei (TW)

(*) Notice: Subject to any disclaimer, the term of this patent is extended or adjusted under 35 U.S.C. 154(b) by 316 days.

(21) Appl. No.: 18/299,063

(22) Filed: Apr. 12, 2023

(65) Prior Publication Data
US 2024/0238710 A1   Jul. 18, 2024

(30) Foreign Application Priority Data
Jan. 16, 2023 (TW) ................ 112101816

(51) Int. Cl.
*B01D 46/00* (2022.01)
*H05K 7/20* (2006.01)

(52) U.S. Cl.
CPC ..... *B01D 46/0086* (2013.01); *H05K 7/20727* (2013.01); *B01D 2279/45* (2013.01)

(58) Field of Classification Search
CPC ............ B01D 46/0086; B01D 2279/45; B01D 46/10; B01D 46/88; H05K 7/20727; G06F 1/206; G01K 13/00
See application file for complete search history.

(56) References Cited

U.S. PATENT DOCUMENTS

| | | | | |
|---|---|---|---|---|
| 5,772,732 A | * | 6/1998 | James | B01D 46/0086 96/417 |
| 5,914,453 A | * | 6/1999 | James | B01D 46/46 96/417 |
| 6,507,282 B1 | * | 1/2003 | Sherwood | B01D 46/46 55/307 |
| 6,888,466 B2 | * | 5/2005 | Dermody | B01D 46/0086 210/138 |
| 9,784,703 B2 | | 10/2017 | Budde | |
| 2006/0070527 A1 | * | 4/2006 | Chapman | B01D 46/0086 96/417 |
| 2011/0316706 A1 | * | 12/2011 | Cash | B01D 46/0086 702/45 |
| 2015/0330924 A1 | * | 11/2015 | Budde | F24F 11/39 374/142 |

(Continued)

FOREIGN PATENT DOCUMENTS

CN     105026868     11/2015

Primary Examiner — Curtis J King
(74) Attorney, Agent, or Firm — JCIPRNET

(57) ABSTRACT

The disclosure provides a server device and a filter replacement reminder method thereof. The filter replacement reminder method is suitable for the server device including a filter and includes the following steps. A current operation temperature of a target component is obtained by using a component temperature sensor. A working state of a heat dissipation component is detected. An ambient temperature is obtained by using an ambient temperature sensor. A reminder to replace the filter is provided by using a human-machine interface according to the current operation temperature, the working state of the heat dissipation component, and the ambient temperature.

18 Claims, 6 Drawing Sheets

(56) References Cited

U.S. PATENT DOCUMENTS

| | | | |
|---|---|---|---|
| 2017/0341001 A1* | 11/2017 | Jousma | B01D 46/0086 |
| 2017/0361259 A1* | 12/2017 | Fox | F24F 11/00 |
| 2020/0023301 A1* | 1/2020 | Ge | G01K 3/10 |
| 2021/0008484 A1* | 1/2021 | Saneyoshi | F25D 29/00 |
| 2021/0076846 A1* | 3/2021 | Saneyoshi | F25D 23/00 |
| 2022/0072463 A1* | 3/2022 | Saneyoshi | F25D 17/042 |
| 2023/0354542 A1* | 11/2023 | Michna | G06F 1/206 |
| 2023/0411728 A1* | 12/2023 | Iwasa | H01M 10/633 |

* cited by examiner

SERVER DEVICE AND FILTER REPLACEMENT REMINDER METHOD THEREOF

CROSS-REFERENCE TO RELATED APPLICATION

This application claims the priority benefit of Taiwan application serial no. 112101816, filed on Jan. 16, 2023. The entirety of the above-mentioned patent application is hereby incorporated by reference herein and made a part of this specification.

BACKGROUND

Technical Field

The disclosure is related to a server device, and in particular, to a server device and a filter replacement reminder method thereof.

Description of Related Art

With the advancement of technology, server devices providing various functions and services have been widely used in people's daily life. The server devices generally have powerful computing power and a large amount of storage space, so they may complete a large amount of work and store a large amount of file data in a short period of time, so as to provide the various services for a large number of users. Many components inside the server device will generate heat energy during operation, so the server device is generally provided with vents and fans to discharge the heat energy inside the server device. In order to prevent the dust in the air from entering the inside of the server device through the vent and affect the performance of the server device, the vent of the server device is generally provided with a filter. The filter may prevent the dust in the air from being brought into the inside of the server device. It is conceivable that as the working time of the server device increases, the dust will gradually accumulate on the filter. A clogged filter will result in a reduction in the air intake, thereby reducing the heat dissipation efficiency.

Therefore, in order to maintain a smooth airflow through the vent, the filter with heavy dust accumulation must be replaced to avoid a decrease in heat dissipation performance and a bad impact on the performance of the server device. Currently, the replacement timing of the filter is based on a rule of thumb, and the server device will prompt the user to replace the filter according to a fixed time limit. For example, whenever the total working time of the server device reaches 6 months, the user is reminded to replace the filter. However, there are a variety of mechanical designs and heat dissipation designs of the server device, and the working state and environment of the server device are also different. Therefore, replacing the filter according to a fixed time limit is not a way to truly replace the filter according to the dust accumulation state. If the filter has serious dust accumulation and is not replaced in time, it will lead to poor operation performance of the server device, and even cause failure of the components in the server device.

SUMMARY

The disclosure provides a filter replacement reminder method and a server device, which may allow the filter of the server device to be replaced at an appropriate time.

An embodiment of the disclosure provides a filter replacement reminder method, which is suitable for a server device including a filter, and includes the following steps. A current operation temperature of a target component is obtained by using a component temperature sensor. A working state of a heat dissipation component is detected. An ambient temperature is obtained by using an ambient temperature sensor. A reminder to replace the filter is provided by using a human-machine interface according to the current operation temperature, the working state of the heat dissipation component, and the ambient temperature.

An embodiment of the disclosure provides a server device, which includes a filter, a component temperature sensor, an ambient temperature sensor, a target component, a heat dissipation component, a human-machine interface, and a controller. The controller is coupled to the component temperature sensor, the ambient temperature sensor, the target component, the heat dissipation component, and the human-machine interface, and is used to execute the following steps. A current operation temperature of the target component is obtained by using the component temperature sensor. A working state of the heat dissipation component is detected. An ambient temperature is obtained by using the ambient temperature sensor. According to the current operation temperature, the working state of the heat dissipation component, and the ambient temperature, a reminder to replace the filter is provided by using the human-machine interface.

Based on the above, in the embodiment of the disclosure, the component temperature sensor may sense the current operation temperature of the target component, and the current operation temperature of the target component may be used to determine the dust accumulation state of the filter. Thus, the reminder to replace the filter may be provided to the user according to the current operation temperature of the target component, the working state of the heat dissipation component, and the ambient temperature. Based on this, the user may know the appropriate time to replace the filter, thus avoiding the late replacement of the filter and causing poor performance or failure of the server device.

DESCRIPTION OF THE EMBODIMENTS

Figure 1:
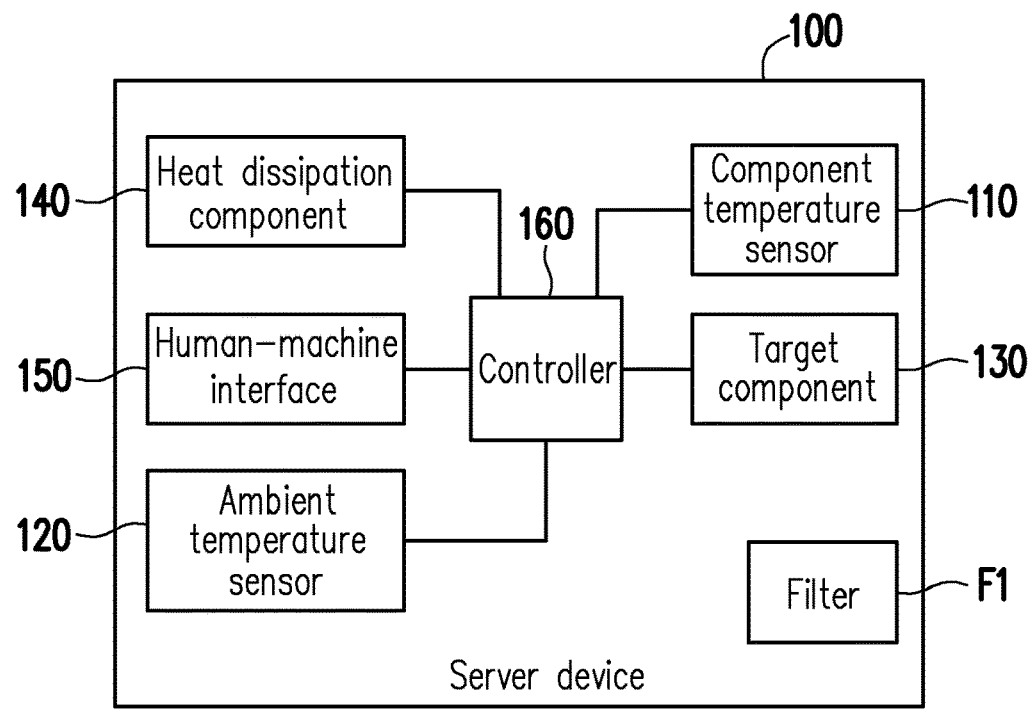
FIG. 1 is a schematic block diagram of a server device according to an embodiment of the disclosure.

Parts of the embodiments of the disclosure will be described in details below with reference to the accompanying drawings. For the reference numerals used in the following description, when the same reference numerals appearing in different drawings will be regarded as the same or similar components. These embodiments are only a part of the disclosure, and do not disclose all possible implementation modes of the disclosure. Rather, these embodiments are only examples of the devices and methods within the scope of the disclosure.

Referring to FIG. 1, FIG. 1 is a schematic diagram of a server device according to an embodiment of the disclosure. A server device 100 may be, for example, a tower server, a rack server, a blade server, a multi-node server, or other types of servers, which is not limited in the disclosure. The server device 100 may include a filter F1, a component temperature sensor 110, an ambient temperature sensor 120, a target component 130, a heat dissipation component 140, a human-machine interface 150, and a controller 160.

The filter F1 may be disposed on the casing or the rack of the server device 100 to prevent external dust from entering the server device 100. In some embodiments, the filter F1 may be disposed at the air inlet. The dust accumulation state of the filter F1 will affect the air intake flow, so the dust accumulation state of the filter F1 will affect the heat dissipation efficiency of the server device 100. The component temperature sensor 110 is used to sense the operation temperature of the target component 130. The target component 130 may be a central processing unit (CPU), a hard disk, a memory module, or other electronic components in the server device 100 that generate heat during operation. The memory module is, for example, a dual in-line memory module (DIMM), but not limited thereto. In an embodiment, when the target component 130 is a CPU, the component temperature sensor 110 may be a built-in temperature sensor of the CPU. Alternatively, in an embodiment, when the target component 130 is a memory module, the component temperature sensor 110 may be a built-in temperature sensor of the memory module.

The ambient temperature sensor 120 is used to sense the ambient temperature of the environment where the server device 100 is located, and may be disposed at a position away from the electronic components that generate heat.

The heat dissipation component 140 may include a fan, a cooling chip, a water-cooled heat dissipation device, other heat dissipation devices, or a combination of these devices. The heat dissipation component 140 provides a heat dissipation function, which may take away the heat energy inside the server device 100.

The human-machine interface 150 may include one or more input devices, such as a touch screen, a keyboard, a mouse, or buttons. The human-machine interface 150 may also include one or more output devices, such as a display, a speaker, or a lighting device. The user of the server device 100 may interact with the server device 100 through the human-machine interface 150. In some embodiments, the controller 160 may provide a reminder to the user to replace the filter F1 through the output device of the human-machine interface 150.

The controller 160 is coupled to the component temperature sensor 110, the ambient temperature sensor 120, the target component 130, the heat dissipation component 140, and the human-machine interface 150. In some embodiments, the controller 160 may be a baseboard management controller (BMC) of the server device 100.

Figure 2:
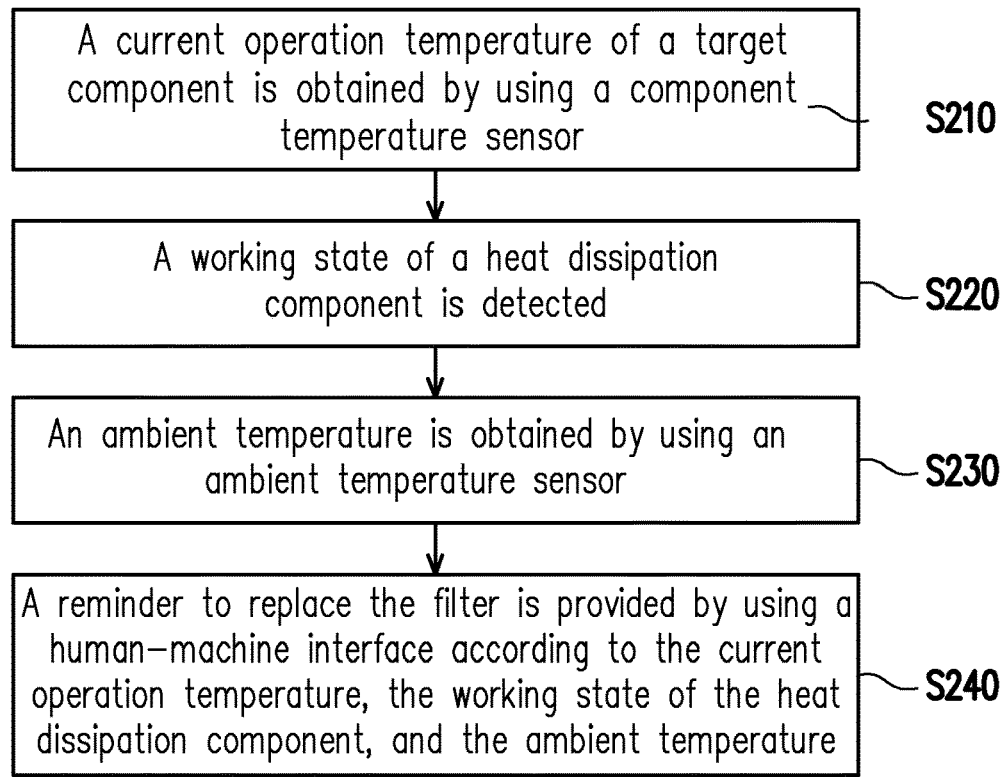
FIG. 2 is a flow diagram of a filter replacement reminder method according to an embodiment of the disclosure.

FIG. 2 is a flow diagram of a filter replacement reminder method according to an embodiment of the disclosure. Referring to FIG. 1 and FIG. 2, the method of the embodiment is suitable for the server device 100 in the above-mentioned embodiment, and the detailed steps of the filter replacement reminder method of the embodiment will be described below in combination with the various components in the server device 100.

In step S210, the controller 160 obtains the current operation temperature of the target component 130 by using the component temperature sensor 110. The component temperature sensor 110 may sense the current operation temperature of the target component 130 and provide the current operation temperature to the controller 160. The operation temperature of the target component 130 is positively related to the ambient temperature. In some embodiments, the operation temperature of the target component 130 is also positively related to the load state of the target component 130.

In step S220, the controller 160 detects the working state of the heat dissipation component 140. In some embodiments, the heat dissipation component 140 may be a fan, and the working state of the heat dissipation component 140 may be the fan speed. When the working state of the heat dissipation component 140 is abnormal, the operation temperature of the target component 130 will increase abnormally.

In step S230, the controller 160 obtains the ambient temperature by using the ambient temperature sensor 120. The ambient temperature sensor 120 may sense the ambient temperature and provide the ambient temperature to the controller 160. The ambient temperature may affect the operation temperature of the target component 130. An increase in the ambient temperature will increase the operation temperature of the target component 130.

In step S240, the controller 160 provides a reminder to replace the filter F1 by using the human-machine interface 150 according to the current operation temperature, the working state of the heat dissipation component 140, and the ambient temperature. In some embodiments, the controller 160 may control the luminous color, the flashing frequency, or whether the light is turned on or not of the lighting device, so as to notify the user whether the filter F1 needs to be replaced. Alternatively, in some embodiments, the controller 160 may control the display to display a reminder message to notify the user whether the filter F1 needs to be replaced.

Specifically, as the use time increases, more and more dust will accumulate on the filter F1. The heat dissipation efficiency of the server device 100 will also decrease as the dust accumulated on the filter F1 increases, thereby affecting the operation temperature of the target component 130. It may be known that the current operation temperature of the target component 130 may be used to evaluate the dust accumulation state of the filter F1. It should be noted that both the ambient temperature and the working state of the heat dissipation component 140 will also affect the current operation temperature of the target component 130. Therefore, the controller 160 may determine whether to replace the filter F1 according to the current operation temperature, the working state of the heat dissipation component 140, and the ambient temperature, and decide whether to use the human-machine interface 150 to provide a reminder for replacing the filter F1. When the controller 160 determines that the filter F1 needs to be replaced, the controller 160 controls the human-machine interface 150 to provide a reminder to replace the filter F1. In this way, the dust accumulation state of the filter F1 is determined according to the current operation temperature of the target component 130, and the user may be reminded to replace the filter F1 at an appropriate time.

In some embodiments, the controller 160 may determine whether the current operation temperature of the target component 130 is greater than or equal to a threshold value, so as to determine whether to provide a reminder to replace the filter F1. In some embodiments, the aforementioned threshold value may be a rated temperature of the target component 130. In some embodiments, in response to the current operation temperature being greater than or equal to the rated temperature of the target component 130, the controller 160 may provide a reminder to replace the filter F1 according to the working state of the heat dissipation component 140 and the ambient temperature. In some embodiments, in response to the current operation temperature being greater than or equal to the rated temperature, the controller 160 may determine whether to provide a reminder to replace the filter F1 according to whether the working state of the heat dissipation component 140 is normal or abnormal. In some embodiments, in response to the current operation temperature being greater than or equal to the rated temperature, the controller 160 may determine whether to provide a reminder to replace the filter F1 according to whether the ambient temperature is too high. Alternatively, in some embodiments, the controller 160 may look up a table according to the ambient temperature, the working state of the heat dissipation component 140, and the current operation temperature to determine whether to provide a reminder to replace the filter F1.

Figure 3:
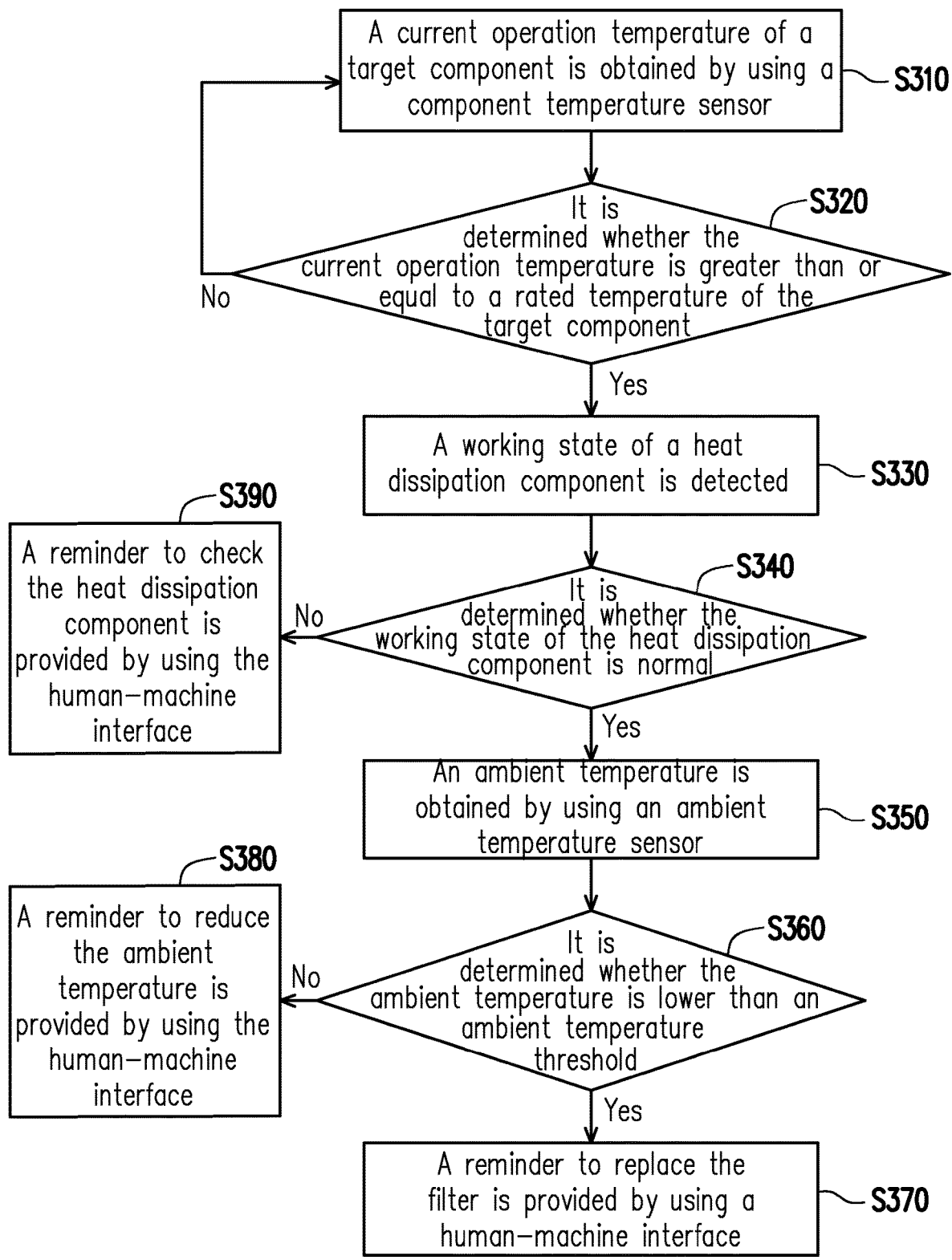
FIG. 3 is a flow diagram of a filter replacement reminder method according to an embodiment of the disclosure.

FIG. 3 is a flow diagram of a filter replacement reminder method according to an embodiment of the disclosure. Referring to FIG. 1 and FIG. 3, the method of the embodiment is suitable for the server device 100 in the above-mentioned embodiment, and the detailed steps of the filter replacement reminder method of the embodiment will be described below in combination with the various components in the server device 100.

In step S310, the controller 160 obtains the current operation temperature of the target component 130 by using the component temperature sensor 110. It is worth mentioning that, in some embodiments, the controller 160 may first notify the target component 130 to operate at a fully loaded state (e.g., maximum utilization or maximum usage). After the target component 130 is operating at a fully loaded state, the controller 160 then obtains the current operation temperature of the target component 130 by using the component temperature sensor 110. In step S320, the controller 160 determines whether the current operation temperature is greater than or equal to the rated temperature of the target component 130. The rated temperature is the maximum operation temperature specified by the manufacturer of the target component 130 for the target component 130. According to the heat dissipation design of the server device 100, when the ambient temperature meets the specification and the heat dissipation component 140 works normally, the operation temperature of the target component 130 will not exceed the rated temperature of the target component 130.

If the determination in step S320 is negative, it means that the filter F1 does not need to be replaced yet, and so returns to step S310. If the determination in step S320 is positive, it means that the filter F1 may need to be replaced. Therefore, if the determination in step S320 is positive, in step S330, the controller 160 detects the working state of the heat dissipation component 140. In step S340, the controller 160 determines whether the working state of the heat dissipation component 140 is normal. In an embodiment, the heat dissipation component 140 may be a fan. The controller 160 may detect the fan speed, and determine whether the fan speed is normal. For example, the controller 160 may control the fan to operate at the maximum speed through a control signal, and determine whether the actual speed reported by the fan is the maximum speed.

If the determination in step S340 is negative, it means that the working state of the heat dissipation component 140 is abnormal. Therefore, if the determination in step S340 is negative, in step S390, the controller 160 provides a reminder to inspect the heat dissipation component 140 by using the human-machine interface 150. On the other hand, if the determination in step S340 is positive, it means that the working state of the heat dissipation component 140 is normal. Therefore, if the determination in step S340 is positive, in step S350, the controller 160 obtains the ambient temperature by using the ambient temperature sensor 120. In step S360, the controller 160 determines whether the ambient temperature is lower than an ambient temperature threshold. The ambient temperature threshold may be set according to actual applications, which is not limited in the disclosure.

If the determination in step S360 is negative, it means that the ambient temperature is too high. Therefore, if the determination in step S360 is negative, in step S380, the controller 160 provides a reminder to reduce the ambient temperature by using the human-machine interface 150. On the other hand, if the determination in step S360 is positive, it means that the ambient temperature is not too high. Therefore, if the determination in step S360 is positive, in step S370, the controller 160 provides a reminder to replace the filter F1 by using human-machine interface 150.

Based on the flow diagram in FIG. 3, when the current operation temperature is greater than or equal to the rated temperature of the target component, the controller 160 may provide a reminder to replace the filter F1 in response to the working state of the heat dissipation component 140 being normal and the ambient temperature being lower than the ambient temperature threshold. In other words, under the condition that the working state of the heat dissipation component 140 is normal and the ambient temperature is lower than the ambient temperature threshold, if the current operation temperature is greater than or equal to the rated temperature of the target component, it means that the heat dissipation efficiency has been reduced due to the filer F1 being blocked to a considerable extent, so replacement is necessary. Otherwise, when the current operation temperature is greater than or equal to the rated temperature of the target component, the controller 160 may determine not to provide a reminder to replace the filter F1 because the working state of the heat dissipation component 140 is abnormal or the ambient temperature is not less than the ambient temperature threshold.

It should be noted that the above-mentioned embodiments are described with one target component 130 as an example, but the disclosure does not limit the number of target components. In other embodiments, the controller 160 may determine whether the current operation temperatures of the multiple target components are greater than or equal to the corresponding rated temperatures. For example, the controller 160 may respectively determine whether the current operation temperature of the CPU is higher than the rated temperature of the CPU, and determine whether the current operation temperature of the memory module is higher than the rated temperature of the memory module. Therefore, the controller 160 may determine whether to provide a reminder to replace the filter F1 according to the current operation temperatures of the multiple target components.

Figure 4A:
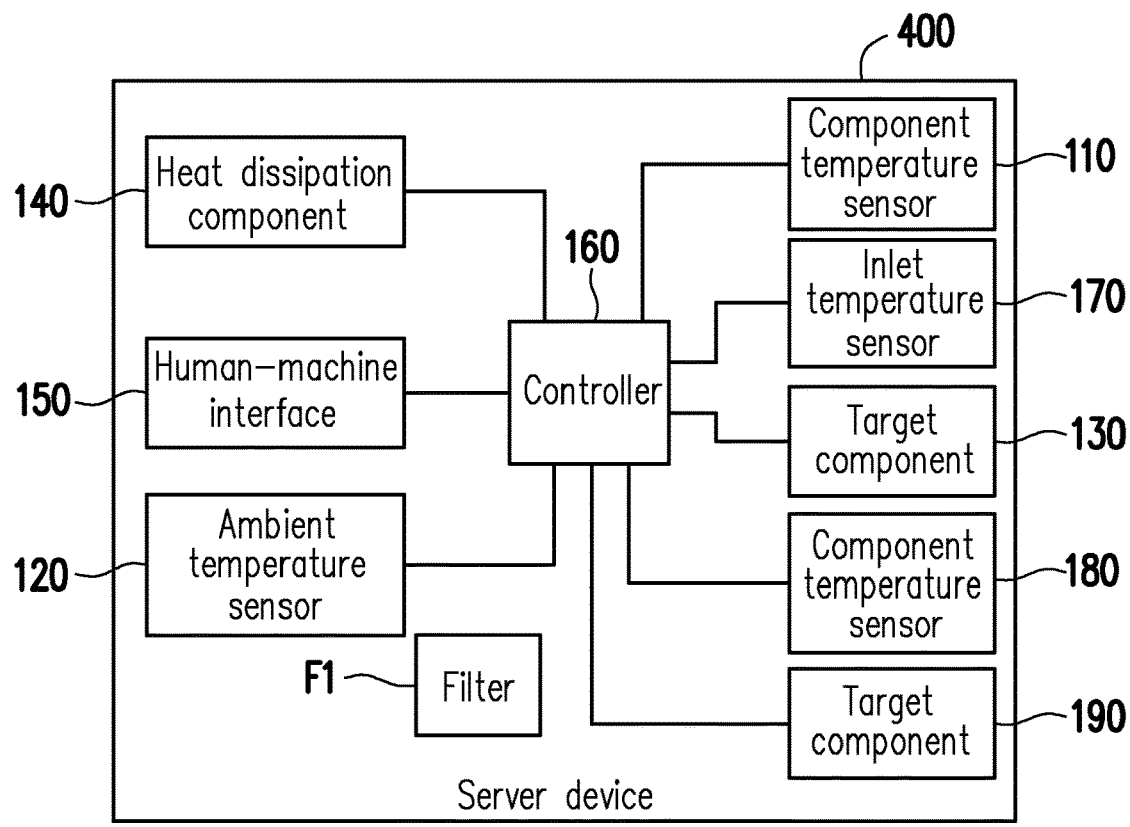
FIG. 4A is a schematic block diagram of a server device according to an embodiment of the disclosure.

FIG. 4A is a schematic block diagram of a server device according to an embodiment of the disclosure. Referring to FIG. 4A, a server device 400 may include the filter F1, the component temperature sensor 110, the ambient temperature sensor 120, the target component 130, the heat dissipation component 140, the human-machine interface 150, the controller 160, and an inlet temperature sensor 170, another component temperature sensor 180, and another target component 190.

The functions and the coupling relationships of the filter F1, the component temperature sensor 110, the ambient temperature sensor 120, the target component 130, the heat dissipation component 140, the human-machine interface 150, and the controller 160 are similar to the functions and the coupling relationships of the foregoing embodiments, and will not be repeated here. It should be noted that the server device 400 of the embodiment further includes the inlet temperature sensor 170, another component temperature sensor 180, and another target component 190. The inlet temperature sensor 170, another component temperature sensor 180, and another target component 190 are coupled to the controller 160.

The component temperature sensor 180 is used to sense the operation temperature of the target component 190. The component temperature sensor 180 may be a built-in temperature sensor of the target component 190. The target component 190 and the target component 130 may be the same device or different devices. For example, the target component 190 and the target component 130 may be two CPUs. Alternatively, the target component 130 may be a CPU, and the target component 190 may be a memory module.

The inlet temperature sensor 170 is used to sense the inlet temperature of the target component 130. The inlet temperature may also be referred to as the fan inlet temperature. The inlet temperature sensor 170 may be disposed between the fan and the target component 130.

Figure 4B:
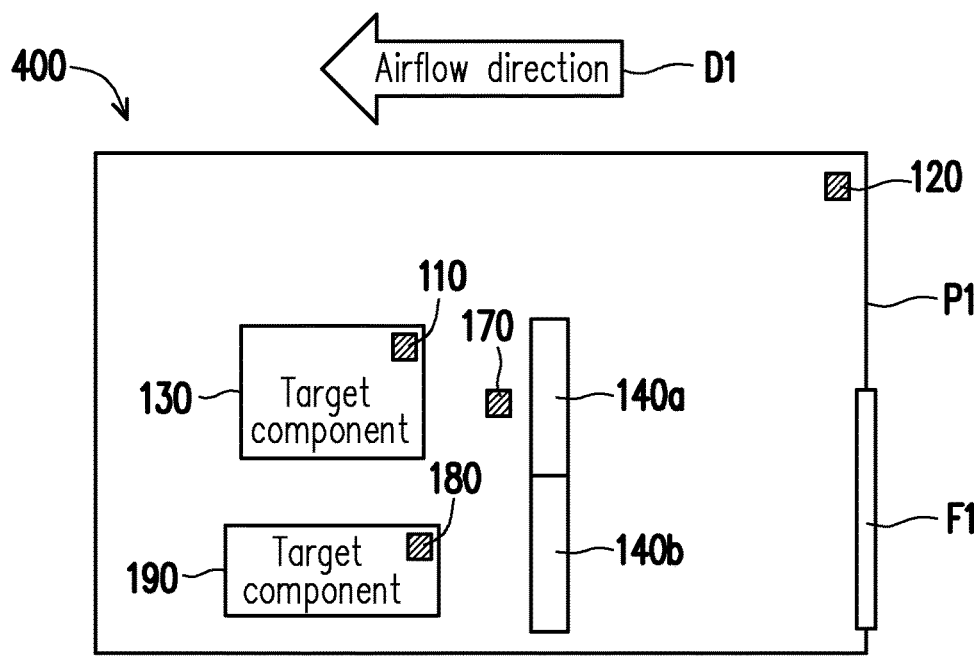
FIG. 4B is a schematic diagram of a server device according to an embodiment of the disclosure.

FIG. 4B is a schematic diagram of a server device according to an embodiment of the disclosure. Referring to FIG. 4B, in the embodiment, the heat dissipation component 140 of the server device 400 may include fans 140a and 140b. The fans 140a and 140b, the target component 130, and the target component 190 may be disposed on a motherboard P1. The filter F1 may be disposed on one side of the fans 140a and 140b, and may be disposed at the air inlet of the casing. The target component 130 and the target component 190 are disposed on the other side of the fans 140a and 140b. Driven by the fans 140a and 140b, the air enters the server device 100 from the air inlet through the filter F1, and reaches the location of the target component 130 and the target component 190 along an airflow direction D1.

The inlet temperature sensor 170 may be disposed on the air channel between the fan 140a and the target component 130 to sense the inlet temperature of the target component 130. The ambient temperature sensor 120 may be disposed at a position away from the target component 130 and the target component 190. The component temperature sensors 110 and 180 may be built-in temperature sensors of the target component 130 and the target component 190, respectively.

Figure 5:
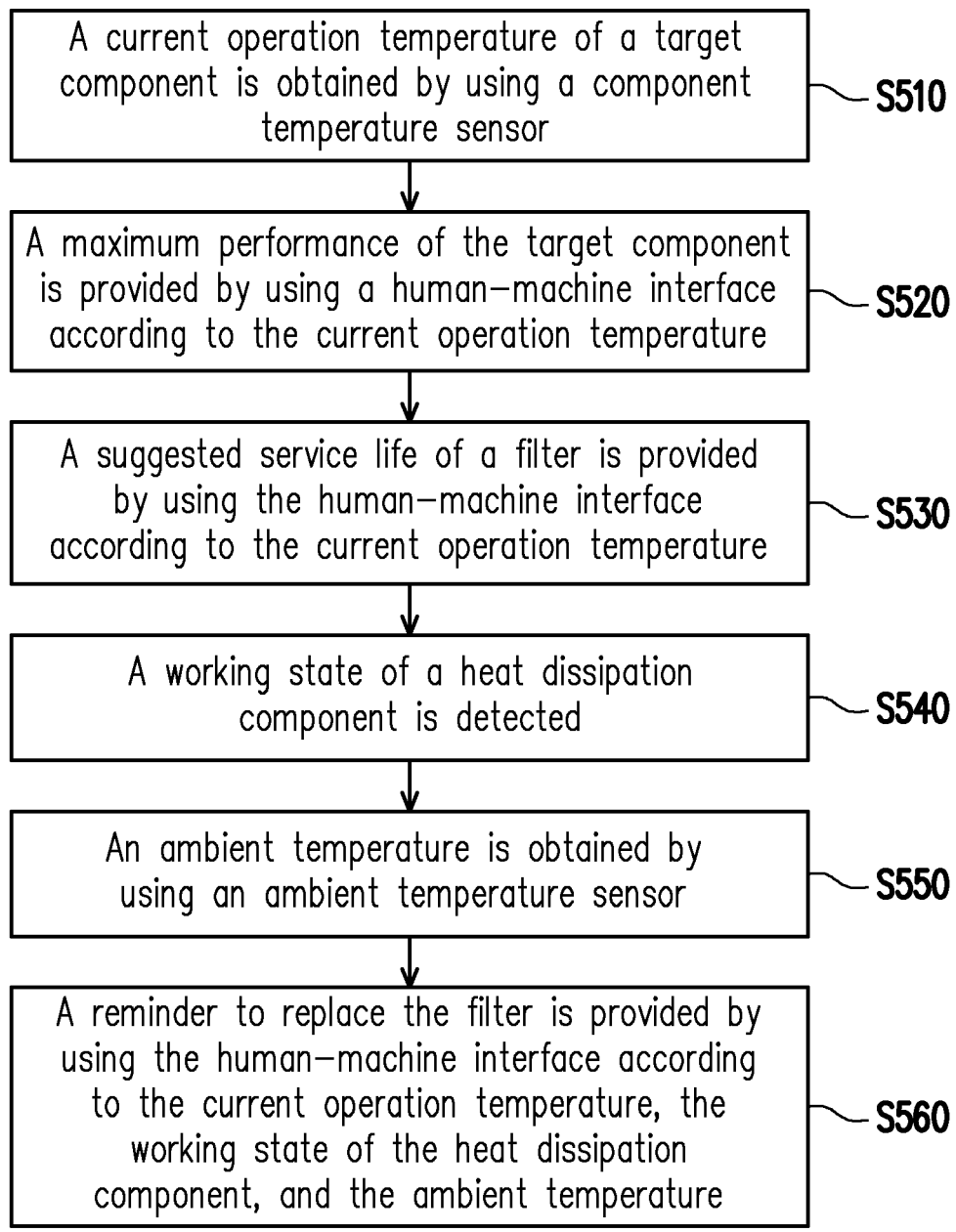
FIG. 5 is a flow diagram of a filter replacement reminder method according to an embodiment of the disclosure.

FIG. 5 is a flow diagram of a filter replacement reminder method according to an embodiment of the disclosure. Referring to FIG. 4A, FIG. 4B, and FIG. 5, the method of the embodiment is suitable for the server device 400 in the above-mentioned embodiment, and the detailed steps of the filter replacement reminder method of the embodiment will be described below in combination with the various components in the server device 400.

It should be noted that in the embodiment, the controller 160 may also estimate the maximum performance and the service life of the filter F1 according to the current operation temperature of the target component 130, and let the user know the maximum performance of the component 130 and the service life of the filter F1 through the human-machine interface.

In step S510, the controller 160 may obtain the current operation temperature of the target component 130 by using the component temperature sensor 110. In addition, the controller 160 may also obtain the current operation temperature of the target component 190 by using the component temperature sensor 180. Therefore, in the subsequent steps, the controller 160 may determine whether to provide a reminder to replace the filter F1 according to the current operation temperatures of the target components 130 and 190, respectively.

In step S520, the controller 160 provide the maximum performance of the target component 130 by using the human-machine interface 150 according to the current operation temperature of the target component 130. Specifically, as the filter F1 accumulates more dust, the heat dissipation efficiency gradually deteriorates due to the reduction of the air intake, and the maximum performance of the target component 130 also decreases due to the deterioration of the heat dissipation efficiency. Here, the controller 160 may estimate the maximum performance that the target component 130 may achieve under the current dust accumulation state of the filter F1. In more detail, the controller 160 may estimate the maximum performance currently supported by the target component 130 according to the current operation temperature and the current performance of the target component 130. For example, the target component 130 may be a CPU, and the maximum performance of the target component 130 estimated by the controller 160 is the highest power wattage of the CPU.

Figure 6:
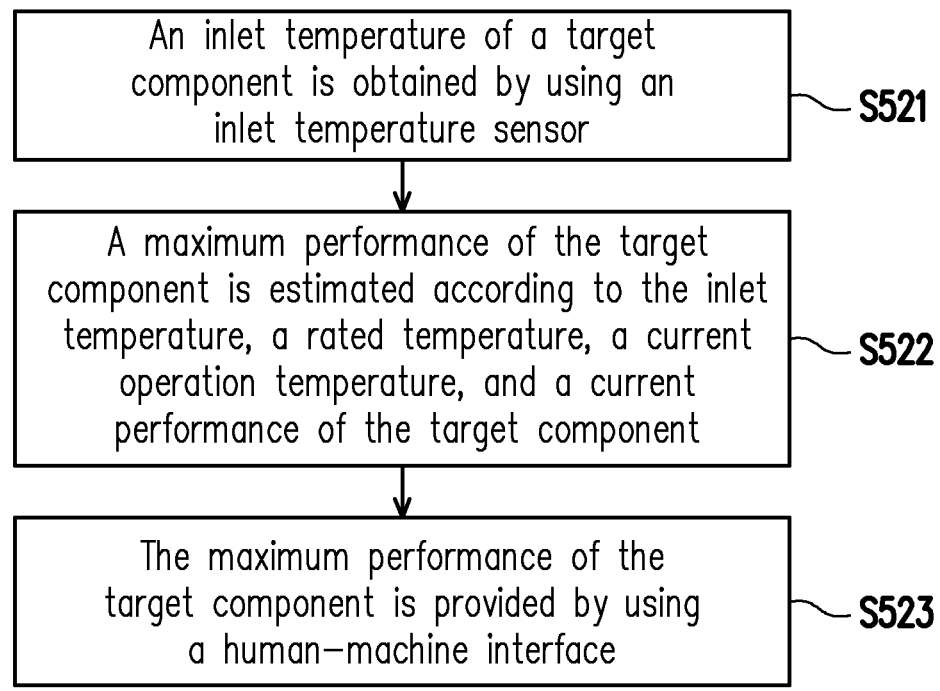
FIG. 6 is a flow diagram of providing a maximum performance of a target component according to an embodiment of the disclosure.

Referring to FIG. 6, FIG. 6 is a flow diagram of providing a maximum performance of a target component according to an embodiment of the disclosure. Step S520 may be implemented as steps S521 to S523. In step S521, the controller 160 obtains the inlet temperature of the target component 130 by using the inlet temperature sensor 170.

In step S522, the controller 160 estimates the maximum performance of the target component 130 according to the inlet temperature, the rated temperature, the current operation temperature, and the current performance of the target component 130. In some embodiments, the current performance of the target component 130 is proportional to the difference between the current operation temperature and the inlet temperature. Therefore, the controller 160 may estimate the maximum performance of the target component 130 based on the current performance of the target component 130 according to the ratio of the first difference between the rated temperature and the inlet temperature to the second difference between the current operation temperature and the inlet temperature. In some embodiments, the target component 130 may be a CPU, and the controller 160 may estimate the maximum performance of the target component 130 according to the following formula (1). Formula (1) may be used to predict the maximum power wattage of the CPU when the current operation temperature of the CPU reaches the rated temperature.

$$CPU\ Power_{support} = CPU\ Power_{average} \times \frac{T_{spec} - T_{in}}{T_j - T_{in}} \quad \text{formula (1)}$$

CPU Power$_{support}$ is the maximum performance of the target component 130. CPU Power$_{average}$ is the current performance of the target component 130. T$_{spec}$ is the rated temperature of the target component 130. Tin is the inlet temperature of the target component 130, and T$_j$ is the current operation temperature of the target component 130. It is worth mentioning that, in some embodiments, the current performance of the target component 130 may be an average value of multiple current detection performances.

In step S523, the controller 160 provides the maximum performance of the target component 130 by using the human-machine interface 150. As the accumulation of dust on the filter F1 becomes severe, the maximum efficiency of the target component 130 estimated by the controller 160 will decrease. The user may know the maximum performance of the target component 130 through the human-machine interface 150, so as to clearly know the performance status of the server device 100. Therefore, the user may also determine whether to replace the filter F1 at one's discretion according to the maximum performance of the target component 130.

Returning to FIG. 5, in step S530, the controller 160 provides a suggested service life of the filter F1 by using the human-machine interface 150 according to the current operation temperature. Specifically, as the filter F1 accumulates more dust, the heat dissipation efficiency gradually deteriorates due to the reduction in the air intake. In some embodiments, the controller 160 may regularly control the target component 130 to operate in a preset load state, and regularly measure multiple operation temperatures when the target component 130 operates in the preset load state. The operation temperatures operating at a preset load state will increase with time due to the gradual deterioration of the heat dissipation efficiency. Therefore, the controller 160 may estimate the service life of the filter F1 according to the linear relationship of the operation temperature (i.e., the current operation temperature and the previous operation temperature) sensed at different time points and the time.

Figure 7:
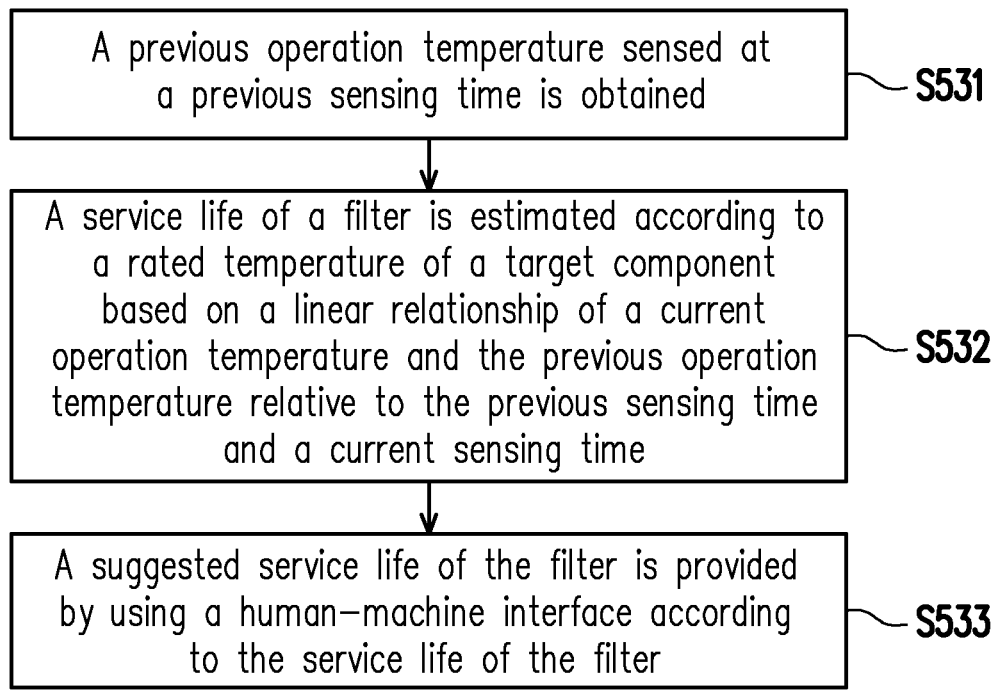
FIG. 7 is a flow diagram of providing a suggested service life of a filter according to an embodiment of the disclosure.

Referring to FIG. 7, FIG. 7 is a flow diagram of providing a suggested service life of a filter according to an embodiment of the disclosure. In step S531, the controller 160 obtains the previous operation temperature sensed at the previous sensing time. That is, the controller 160 obtains the previous operation temperature of the target component 130 by using the component temperature sensor 110 at the previous sensing time. For example, the controller 160 may regularly obtain the operation temperature of the target component 130 every other day, a week, or a month. The current operation temperature is sensed at the current sensing time. It should be noted that both the previous operation temperature and the current operation temperature correspond to the preset load state of the target component 130. The preset load state is, for example, a fully loaded state. That is, the controller 160 obtains the previous operation temperature and the current operation temperature through the component temperature sensor 110 when the target component 130 is operating under a preset load state.

Figure 8:
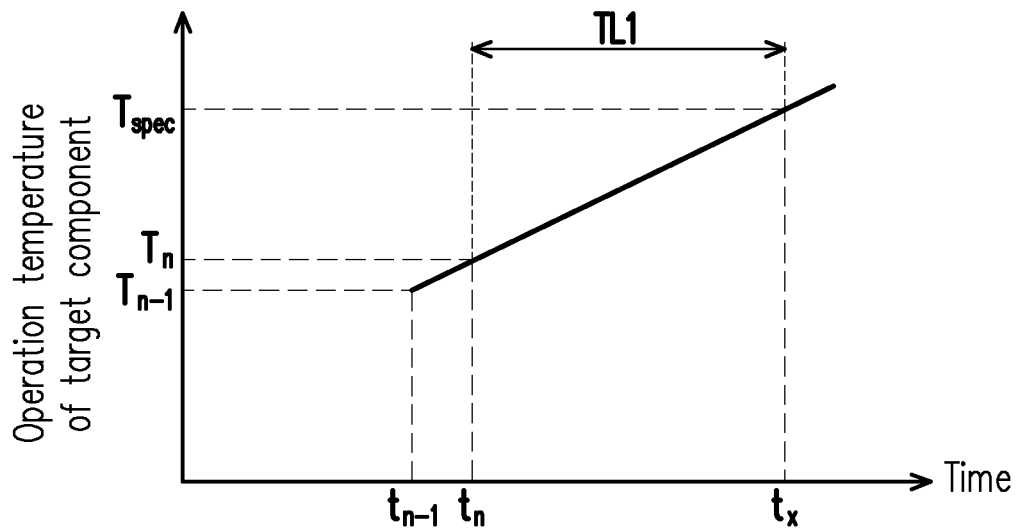
FIG. 8 is a schematic diagram of estimating a service life of a filter according to an embodiment of the disclosure.

In step S532, the controller 160 estimates the service life of the filter F1 according to the rated temperature of the target component 130 based on the linear relationship of the current operation temperature and the previous operation temperature relative to the previous sensing time and the current sensing time. For details, please refer to FIG. 8, which is a schematic diagram of estimating a service life of a filter according to an embodiment of the disclosure. t$_n$ is the current sensing time. t$_{n-1}$ is the previous sensing time. t$_x$ is the predicted time when the operation temperature of the target component 130 reaches the rated temperature T$_{spec}$. T$_n$ is the current operation temperature. T$_{n-1}$ is the previous operation temperature. The controller 160 may estimate the service life TL1 of the filter F1 according to the following formula (2).

$$TL1 = t_x - t_n = \frac{(T_{spec} - T_n) \times (t_n - t_{n-1})}{T_n - T_{n-1}} \quad \text{formula (2)}$$

In step S533, the controller 160 provides a suggested service life of the filter F1 by using the human-machine interface 150 according to the service life of the filter F1. Accordingly, the user may know the suggested service life of the filter F1 through the human-machine interface 150. Therefore, the user may also determine whether to replace the filter F1 at one's discretion according to the suggested service life of the filter F1. Alternatively, the user may prepare for the replacement of the filter F1 in advance according to the suggested service life of the filter F1.

Take the target component 130 is CPU for example, the rated temperature T$_{spec}$ of CUP is 100° ° C. In some embodiments, the suggested service life of the filter F1 may be the service life TL1 calculated according to the latest current operation temperature shown in FIG. 8. Alternatively, in some embodiments, since the controller 160 may regularly calculate the service life of the filter F1, the controller 160 may use the minimum of the service life calculated at different time points as the suggested service life of the filter F1.

In some embodiments, the controller 160 may also obtain another previous operation temperature sensed at another previous sensing time. It should be noted that both the previous operation temperature and another previous operation temperature correspond to the preset load state of the target component 130. The preset load state is, for example, a fully loaded state. That is, the controller 160 obtains the previous operation temperature and another previous operation temperature through the component temperature sensor 110 when the target component 130 operates under a preset load state. Afterwards, the controller 160 may estimate another service lift of the filter F1 according to the rated temperature of the target component 130 based on another linear relationship of the previous operation temperature and another previous operation temperature relative to the previous sensing time and another previous sensing time. The suggested service life may be the shorter of the service life and another service life.

Figure 9:
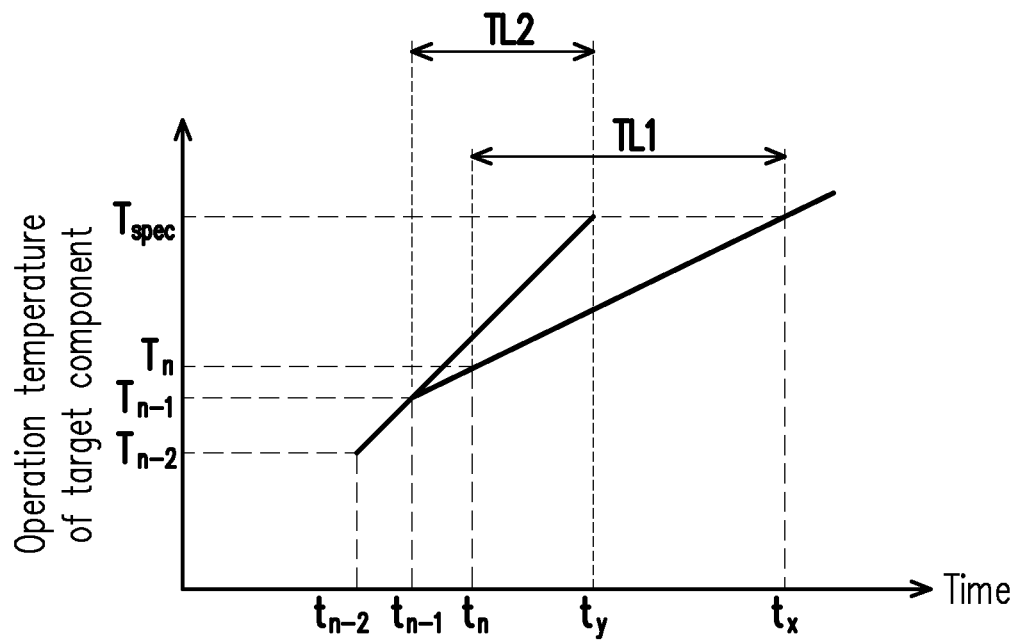
FIG. 9 is a schematic diagram of estimating a service life of a filter according to an embodiment of the disclosure.

For details, please refer to FIG. 9, which is a schematic diagram of estimating a service life of a filter according to an embodiment of the disclosure. t$_n$ is the current sensing time. t$_{n-1}$ is the previous sensing time. t$_{n-2}$ is another previous sensing time. t$_x$ and ty are the predicted times when the operation temperature of the target component 130 reaches the rated temperature T$_{spec}$. T$_n$ is the current operation temperature. T$_{n-1}$ is the previous operation temperature. T$_{n-2}$ is another previous operation temperature. The controller 160 may estimate the service life TL1 of the filter F1 according to formula (2). Moreover, the controller 160 may estimate another service life TL2 of the filter F1 according to the following formula (3).

$$TL2 = t_y - t_{n-1} = \frac{(Tspec - T_{n-1}) \times (t_{n-1} - t_{n-2})}{T_{n-1} - T_{n-2}} \quad \text{formula (3)}$$

In the example of FIG. 9, take the target component 130 is CPU for example, the rated temperature $T_{spec}$ of CUP is 100° C. Therefore, the controller 160 may select the shorter of another service life TL2 and the service life TL1 as the recommended service life of the filter F1. The controller 160 may determine that the suggested service life may be another service life TL2 due to another service life TL2 being less than the service life TL1.

In addition, in some embodiments, based on the same principle and operation process, the controller 160 may also estimate another service life of the filter F1 according to the current operation temperature of another target component 190. Thus, the suggested service life may be the shorter of the service life corresponding to the target component 130 and another service life corresponding to the target component 190. In more detail, the controller 160 may obtain another current operation temperature and another previous operation temperature of another target component 190 by using another component temperature sensor 180. The controller 160 may estimate another service life of the filter F1 according to another rated temperature of another target component 190, another current operation temperature, and another previous operation temperature. Therefore, the controller 160 may select the shorter of another service life corresponding to another target component 190 and the service life corresponding to the target component 130 as the suggested service life of the filter F1.

Afterwards, returning to FIG. 5 again, at step S540, the controller 160 detects the working state of the heat dissipation component 140. In step S550, the controller 160 obtains the ambient temperature by using the ambient temperature sensor 120. In step S560, the controller 160 provides a reminder to replace the filter F1 by using the human-machine interface 150 according to the current operation temperature of the target component 130, the working state of the heat dissipation component 140, and the ambient temperature. Similarly, the controller 160 may also provide a reminder to replace the filter F1 by using the human-machine interface 150 according to the current operation temperature of the target component 190, the working state of the heat dissipation component 140, and the ambient temperature. The detailed implementation steps of step S540 to step S560 have been described in the foregoing embodiments, and will not be repeated here.

It is worth mentioning that, in some embodiments, the user may set the inspection frequency of the filter F1 through the software interface, such as every half a month or a week, which is not limited in the disclosure. The controller 160 may regularly execute the process shown in FIG. 5 according to the inspection frequency set by the user. Whenever the process shown in FIG. 5 is to be executed, the controller 160 may set the fan operation to the maximum speed and control the target component 130 to operate at a preset load state, so as to detect whether the fan speed is normal and to estimate the service life of the filter F1.

To sum up, in the embodiment of the disclosure, the component temperature sensor may sense the current operation temperature of the target component, and the current operation temperature of the target component may be used to determine the dust accumulation state of the filter. Therefore, a reminder to replace the filter may be provided to the user according to the current operation temperature of the target component, the working state of the heat dissipation component, and the ambient temperature. Since the filter of the server device may be replaced at the appropriate time, it may not only avoid unnecessary waste caused by replacing the filter too early, but also avoid the noise and the power consumption of the continuous high-speed operation of the fan when the filter is replaced too late, the poor performance of the server device, or the failure of the components within the server device.

In addition, the suggested service life of the filter and the maximum performance of the target component may also be estimated according to the current operation temperature of the target component and be provided to the user through the human-machine interface. In this way, the user may clearly understand the dust accumulation status of the filter through the suggested service life of the filter and the maximum performance of the target component, and may determine whether to replace the filter at one's discretion or prepare a spare filter in advance. In addition, the filter replacement reminder method of the embodiment of the disclosure is suitable for any type of server device.

What is claimed is:

1. A filter replacement reminder method, suitable for a server device comprising a filter, comprising:
   obtaining a current operation temperature of a target component by using a component temperature sensor;
   detecting a working state of a heat dissipation component;
   obtaining an ambient temperature by using an ambient temperature sensor; and
   providing a reminder to replace the filter by using a human-machine interface by the current operation temperature, the working state of the heat dissipation component, and the ambient temperature,
   wherein the step of providing the reminder to replace the filter by using the human-machine interface by the current operation temperature, the working state of the heat dissipation component, and the ambient temperature comprises:
   providing the reminder to replace the filter by the working state of the heat dissipation component and the ambient temperature, in response to the current operation temperature being greater than or equal to a rated temperature of the target component.

2. The filter replacement reminder method according to claim 1, wherein the step of providing the reminder to replace the filter by the working state of the heat dissipation component and the ambient temperature in response to the current operation temperature being greater than or equal to the rated temperature of the target component comprises:
   providing the reminder to replace the filter, in response to the working state of the heat dissipation component being normal and the ambient temperature being lower than an ambient temperature threshold.

3. The filter replacement reminder method according to claim 1, wherein the heat dissipation component comprises a fan, and the working state of the heat dissipation component comprises a fan speed.

4. The filter replacement reminder method according to claim 1, wherein the target component comprises a central processing unit, a hard disk, or a memory module.

5. The filter replacement reminder method according to claim 1, further comprising:
   obtaining a previous operation temperature sensed at a previous sensing time, wherein the current operation temperature is sensed at a current sensing time;
   estimating a service life of the filter by a rated temperature of the target component based on a linear relationship of the current operation temperature and the previous operation temperature relative to the previous sensing time and the current sensing time; and providing a suggested service life of the filter by using the human-machine interface by the service life of the filter, wherein the previous operation temperature and the current operation temperature both correspond to a preset load state of the target component.

6. The filter replacement reminder method according to claim 5, further comprising:

estimating an another service life of the filter by the rated temperature of the target component based on an another linear relationship of the previous operation temperature and an another previous operation temperature relative to the previous sensing time and an another previous sensing time, wherein the suggested service life is the shorter of the service life and the another service life, and the previous operation temperature and the another previous operation temperature both correspond to the preset load state of the target component.

7. The filter replacement reminder method according to claim 5, further comprising:

obtaining an another current operation temperature and the another previous operation temperature of an another target component by using an another component temperature sensor; and estimating the another service life of the filter by an another rated temperature of the another target component, the another current operation temperature, and the another previous operation temperature, wherein the suggested service life is the shorter of the service life and the another service life.

8. The filter replacement reminder method according to claim 1, wherein the target component comprises a central processing unit, and the method further comprises:

obtaining an inlet temperature of the target component by using an inlet temperature sensor;

estimating a maximum performance of the target component by the inlet temperature, a rated temperature, the current operation temperature, and a current performance of the target component; and providing the maximum performance of the target component by using the human-machine interface.

9. The filter replacement reminder method according to claim 8, wherein the step of calculating the maximum performance of the target component by the inlet temperature, the rated temperature, the current operation temperature, and the current performance of the target component comprises:

estimating the maximum performance of the target component based on the current performance of the target component by a ratio of a first difference between the rated temperature and the inlet temperature and a second difference between the current operation temperature and the inlet temperature.

10. A server device, comprising:
a filter;
a component temperature sensor;
an ambient temperature sensor;
a target component;
a heat dissipation component;
a human-machine interface; and
a controller, coupled to the component temperature sensor, the ambient temperature sensor, the target component, the heat dissipation component, and the human-machine interface, wherein the controller is for:

obtaining a current operation temperature of the target component by using the component temperature sensor;

detecting a working state of the heat dissipation component;

obtaining an ambient temperature by using the ambient temperature sensor; and providing a reminder for replacing the filter by using the human-machine interface by the current operation temperature, the working state of the heat dissipation component, and the ambient temperature, wherein the controller is for:

providing the reminder to replace the filter by the working state of the heat dissipation component and the ambient temperature, in response to the current operation temperature being greater than or equal to a rated temperature of the target component.

11. The server device according to claim 10, wherein the controller is for:

providing the reminder to replace the filter, in response to the working state of the heat dissipation component being normal and the ambient temperature being lower than an ambient temperature threshold.

12. The server device according to claim 10, wherein the heat dissipation component comprises a fan, and the working state of the heat dissipation component comprises a fan speed.

13. The server device according to claim 10, wherein the target component comprises a central processing unit, a hard disk, or a memory module.

14. The server device according to claim 10, wherein the controller is for:

obtaining a previous operation temperature sensed at a previous sensing time, wherein the current operation temperature is sensed at a current sensing time;

estimating a service life of the filter by a rated temperature of the target component based on a linear relationship of the current operation temperature and the previous operation temperature relative to the previous sensing time and the current sensing time; and providing a suggested service life of the filter by using the human-machine interface by the service life of the filter, wherein the previous operation temperature and the current operation temperature both correspond to a preset load state of the target component.

15. The server device according to claim 14, wherein the controller is for:

estimating an another service life of the filter by the rated temperature of the target component based on an another linear relationship of the previous operation temperature and an another previous operation temperature relative to the previous sensing time and an another previous sensing time, wherein the suggested service life is the shorter of the service life and the another service life, and the previous operation temperature and the another previous operation temperature both correspond to the preset load state of the target component.

16. The server device according to claim 14, further comprising an another component temperature sensor and the another target component, wherein the controller is coupled to the another component temperature sensor and the another target component, and is for:

obtaining another current operation temperature and another previous operation temperature of the another target component by using the another component temperature sensor; and estimating another service life of the filter by an another rated temperature of the another target component, the another current operation temperature, and the another previous operation temperature, wherein the suggested service life is the shorter of the service life and the another service life.

17. The server device according to claim 10, further comprising an inlet temperature sensor, wherein the target component comprises a central processing unit, and the controller is for:

obtaining an inlet temperature of the target component by using the inlet temperature sensor;

estimating a maximum performance of the target component by the inlet temperature, a rated temperature, the current operation temperature, and a current performance of the target component; and providing the maximum performance of the target component by using the human-machine interface.

18. The server device according to claim 17, wherein the controller is for:

estimating the maximum performance of the target component based on the current performance of the target component by a ratio of a first difference between the rated temperature and the inlet temperature and a second difference between the current operation temperature and the inlet temperature.

* * * * *